(12) United States Patent
Mochizuki et al.

(10) Patent No.: US 10,388,766 B2
(45) Date of Patent: Aug. 20, 2019

(54) VERTICAL TRANSPORT FET (VFET) WITH DUAL TOP SPACER

(71) Applicant: International Business Machines Corporation, Armonk, NY (US)

(72) Inventors: Shogo Mochizuki, Clifton Park, NY (US); Michael P. Belyansky, Halfmoon, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/791,095

(22) Filed: Oct. 23, 2017

(65) Prior Publication Data

US 2019/0123174 A1 Apr. 25, 2019

(51) Int. Cl.
*H01L 29/66* (2006.01)
*H01L 29/78* (2006.01)
*H01L 21/8238* (2006.01)
*H01L 21/8234* (2006.01)

(52) U.S. Cl.
CPC .......... *H01L 29/66795* (2013.01); *H01L 21/823487* (2013.01); *H01L 21/823864* (2013.01); *H01L 29/66553* (2013.01); *H01L 29/66666* (2013.01); *H01L 29/7827* (2013.01); *H01L 29/7831* (2013.01); *H01L 2029/7858* (2013.01)

(58) Field of Classification Search
CPC ......... H01L 29/66795; H01L 29/66666; H01L 21/823487; H01L 29/7827
See application file for complete search history.

(56) References Cited

U.S. PATENT DOCUMENTS

| | | | |
|---|---|---|---|
| 7,037,994 B2 | 5/2006 | Sugita et al. |
| 7,244,549 B2 | 7/2007 | Iwasawa et al. |
| 7,298,011 B2 | 11/2007 | Thei et al. |
| 7,303,855 B2 | 12/2007 | Hatakeyama et al. |
| 7,358,025 B2 | 4/2008 | Hatakeyama |
| 7,659,179 B2 | 2/2010 | Hu |
| 8,680,602 B2 | 3/2014 | Sim et al. |
| 9,368,572 B1 | 6/2016 | Cheng et al. |
| 9,437,503 B1 | 9/2016 | Mallela et al. |
| 9,443,982 B1 | 9/2016 | Balakrishnan et al. |
| 9,466,699 B2 | 10/2016 | Guo et al. |

(Continued)

*Primary Examiner* — Lex H Malsawma
*Assistant Examiner* — Xia L Cross
(74) *Attorney, Agent, or Firm* — Vazken Alexanian; Michael J. Chang, LLC

(57) ABSTRACT

A VFET device with a dual top spacer to prevent source/drain-to-gate short, and techniques for formation thereof are provided. In one aspect, a method of forming a VFET device includes: etching vertical fin channels in a substrate; forming a bottom source and drain in the substrate beneath the vertical fin channels; forming a bottom spacer on the bottom source and drain; depositing a gate dielectric and gate conductor onto the vertical fin channels; recessing the gate dielectric and gate conductor to expose tops of the vertical fin channels; selectively forming dielectric spacers on end portions of the gate dielectric and gate conductor adjacent to the tops of the vertical fin channels; depositing an encapsulation layer onto the vertical fin channels; recessing the encapsulation layer with the dielectric spacers serving as an etch stop; and forming top source and drains. A VFET device formed using the present techniques is also provided.

12 Claims, 15 Drawing Sheets

(56) References Cited

U.S. PATENT DOCUMENTS

| | | |
|---|---|---|
| 9,530,863 B1 | 12/2016 | Zhang et al. |
| 9,530,866 B1 * | 12/2016 | Zhang .............. H01L 29/66666 |
| 9,960,271 B1 * | 5/2018 | Xie .................... H01L 29/7827 |
| 2016/0268396 A1 | 9/2016 | Guo et al. |
| 2017/0025305 A1 | 1/2017 | Cheng et al. |
| 2018/0138046 A1 * | 5/2018 | Bentley ............. H01L 21/28123 |

* cited by examiner

VERTICAL TRANSPORT FET (VFET) WITH DUAL TOP SPACER

FIELD OF THE INVENTION

The present invention relates to vertical transport field-effect transistor (VFET) devices, and more particularly, to a structure and method to form a VFET device with a dual top spacer to prevent a source/drain-to-gate short.

BACKGROUND OF THE INVENTION

As opposed to planar complementary metal oxide semiconductor (CMOS) devices, vertical field effect transistors (VFETs) are oriented with a vertical fin channel disposed on a bottom source and drain and a top source and drain disposed on the fin channel. VFETs are being explored as a viable device option for continued CMOS scaling beyond the 7 nanometer (nm) technology node.

Once the gate has been formed on the vertical fin channel, a notable challenge associated with the VFET design is to be able to then form the source and drain on top of the channel without undesirably creating a short to the gate. Specifically, in order to form the top source/drain, the top of the vertical fin channel has to be exposed. During this process, the gate surrounding the vertical fin channel can also inadvertently become exposed. Thus, when the top source and drain epitaxy is grown on the top of the vertical fin channel, parasitic growth can also occur on the exposed gate merging with the top source and drain and shorting the top source and drain to the gate.

Thus, improved techniques for fabricating a VFET device whereby the gate is protected during the top source and drain epitaxy would be desirable.

SUMMARY OF THE INVENTION

The present invention provides a vertical transport field-effect transistor (VFET) device with a dual top spacer to prevent a source/drain-to-gate short, and techniques for formation thereof. In one aspect of the invention, a method of forming a VFET is provided. The method includes: etching vertical fin channels in a substrate such that the vertical fin channels extend partway through the substrate; forming a bottom source and drain in the substrate beneath the vertical fin channels; forming a bottom spacer on the bottom source and drain; depositing a conformal gate dielectric onto the vertical fin channels; depositing a conformal gate conductor onto the conformal gate dielectric; recessing the conformal gate dielectric and the conformal gate conductor to expose tops of the vertical fin channels, wherein the recessing results in end portions of the conformal gate dielectric and the conformal gate conductor being formed adjacent to the tops of the vertical fin channels; selectively forming dielectric spacers on the end portions of the conformal gate dielectric and the conformal gate conductor; depositing an encapsulation layer onto the vertical fin channels and over the conformal gate dielectric, the conformal gate conductor and the dielectric spacers; recessing the encapsulation layer at the tops of the vertical fin channels with the dielectric spacers serving as an etch stop; and forming top source and drains on the tops of the vertical fin channels.

In another aspect of the invention, a VFET device is provided. The VFET device includes: vertical fin channels extending partway through a substrate; a bottom source and drain in the substrate beneath the vertical fin channels; a bottom spacer on the bottom source and drain; a conformal gate dielectric along sidewalls the vertical fin channels; a conformal gate conductor on the conformal gate dielectric; dielectric spacers on end portions of the conformal gate dielectric and the conformal gate conductor adjacent to tops of the vertical fin channels; an encapsulation layer over the conformal gate dielectric, the conformal gate conductor and the dielectric spacers; and top source and drains on the tops of the vertical fin channels.

A more complete understanding of the present invention, as well as further features and advantages of the present invention, will be obtained by reference to the following detailed description and drawings.

DETAILED DESCRIPTION OF PREFERRED EMBODIMENTS

As described above, an exposed gate during top source and drain formation in a vertical transport field-effect transistor (VFET) device can undesirably result in a source/drain-to-gate short. Advantageously, provided herein are techniques for fabricating a VFET device whereby a dielectric top spacer or a dielectric/metal protection layer dual top spacer is in place to protect the gate during the top source and drain epitaxy.

Several different embodiments are presented herein for forming a VFET with the present top spacer design. A first exemplary embodiment is described by way of reference to FIGS. 1-18, wherein a single layer dielectric top spacer is formed on the gate at the top source/drain. Other exemplary embodiments will also be described below where an additional metal protection layer is used in conjunction with the dielectric top spacer (i.e., a dual spacer design) which gives the added benefit of preventing oxidation of the (metal) gate during the spacer formation.

In a first exemplary embodiment, the process begins with the formation of a plurality of fin hardmasks 104 on a substrate 102. See FIG. 1. According to an exemplary embodiment, substrate 102 is an undoped silicon (Si) substrate such as a bulk Si wafer, or a silicon-on-insulator (SOI) wafer. In general, an SOI wafer includes an SOI layer separated from an underlying substrate by a buried insulator. When the buried insulator is an oxide it is often referred to as a buried oxide or BOX.

The fin hardmasks 104 can be formed on the substrate 102 using standard lithography and etching techniques. For instance, a hardmask material can be deposited onto the substrate 102, and then patterned into the individual fin hardmasks 104. Suitable fin hardmask materials include, but are not limited to, nitride hardmask materials such as silicon nitride (SiN).

Figure 1:
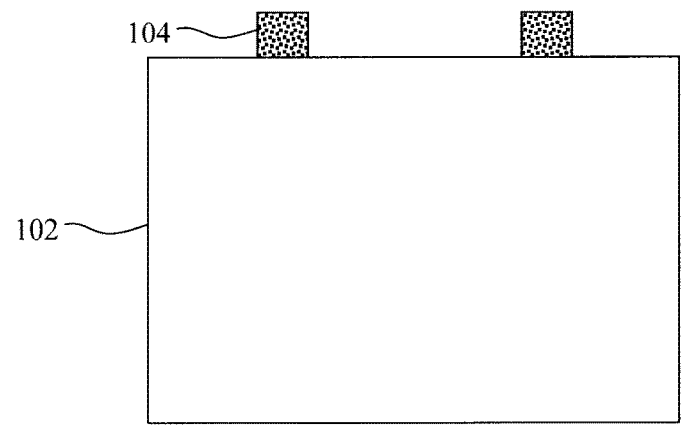
FIG. 1 is a cross-sectional diagram illustrating fin hardmasks having been formed on a (e.g., silicon (Si) substrate according to an embodiment of the present invention.
Figure 2:
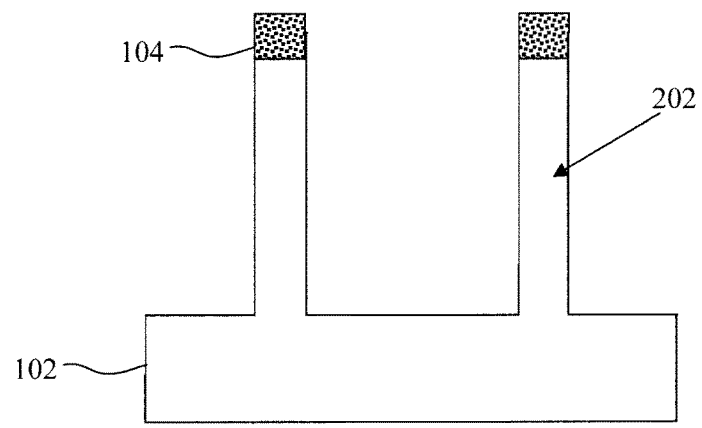
FIG. 2 is a cross-sectional diagram illustrating vertical fin channels having been etched in the substrate using the fin hardmasks according to an embodiment of the present invention.
Figure 3:
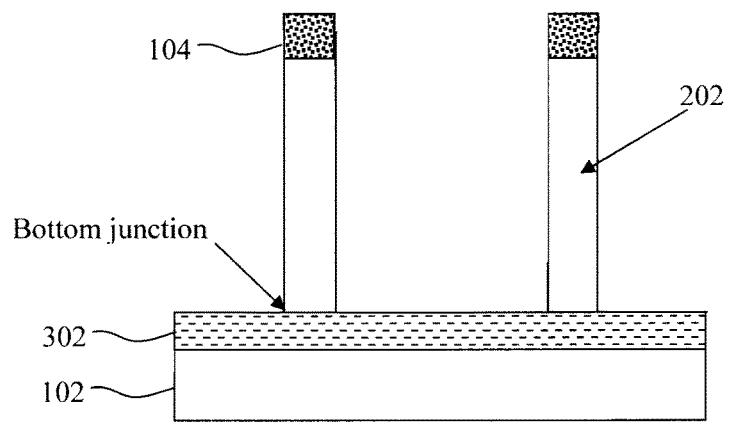
FIG. 3 is a cross-sectional diagram illustrating a bottom source and drain having been formed in the substrate beneath the vertical fin channels according to an embodiment of the present invention.
Figure 4:
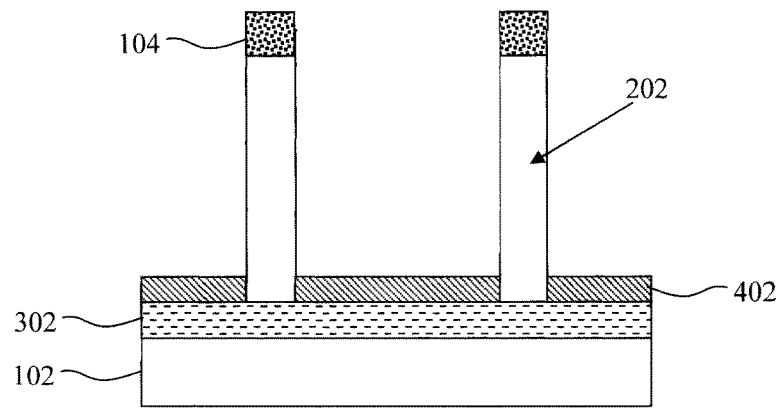
FIG. 4 is a cross-sectional diagram illustrating a bottom spacer having been formed on the bottom source and drain according to an embodiment of the present invention.
Figure 5:
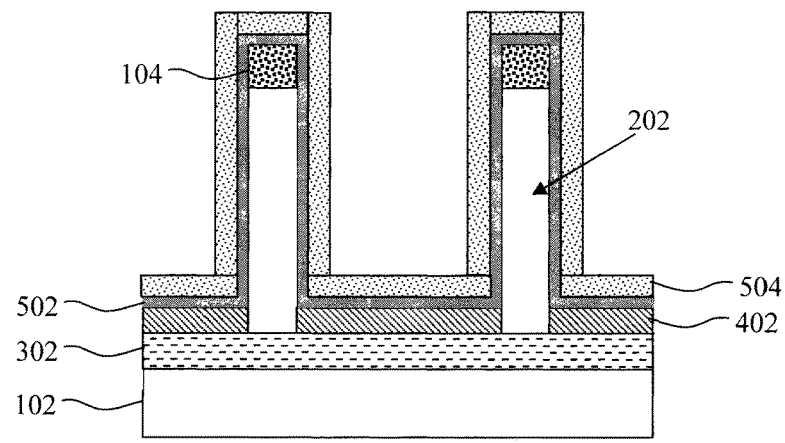
FIG. 5 is a cross-sectional diagram illustrating a conformal gate dielectric having been deposited onto the vertical fin channels, and a conformal gate conductor having been deposited onto the gate dielectric according to an embodiment of the present invention.

As shown in FIG. 2, vertical fin channels 202 are then etched in the (Si) substrate 102 using the fin hardmasks 104. As shown in FIG. 2, the fin etch is endpointed when the vertical fin channels 202 are formed partway through the substrate 102 (i.e., an (unpatterned) portion of the substrate 102 remains beneath the fins 202). A bottom source and drain 302 is then formed in the substrate 102 beneath the vertical fin channels 202. See FIG. 3. According to an exemplary embodiment, the bottom source and drain 302 is formed by ion implantation whereby a suitable n-type or p-type dopant is implanted into the substrate 102 beneath the vertical fin channels 202. Suitable n-type dopant includes, but are not limited to, phosphorous (P) and arsenic (As), and suitable p-type dopants include, but are not limited to, boron (B).

Formation of the bottom source and drain 302 creates a bottom junction between the bottom source and drain 302 and the vertical fin channels 202. See FIG. 3.

Next a bottom spacer 402 is formed on the bottom source and drain 302. See FIG. 4. As will become apparent from the description that follows, the bottom spacer 402 offsets the bottom source and drain 302 from the gate (that will be formed surrounding the vertical fin channel 202). According to an exemplary embodiment, the bottom spacer 402 is formed using a directional deposition process whereby a spacer material is deposited onto the bottom source and drain 302 and vertical fin channels 202 with a greater amount of the material being deposited on the horizontal surfaces, as compared to the vertical surfaces. To use an illustrative example, a greater thickness of the spacer material will be deposited on top of the bottom source and drain 302 in between the vertical fin channels 202 than along the sidewalls of the vertical fin channels 202. Thus, when an etch is used on the spacer material, the timing of the etch needed to remove the spacer material from the vertical surfaces will leave the bottom spacer 402 shown in FIG. 4 on top of bottom source and drain 302 since a greater amount of the spacer material was present on the bottom source and drain 302 to begin with. By way of example only, a high density plasma (HDP) chemical vapor deposition (CVD) or physical vapor deposition (PVD) process can be used for directional film deposition, and an isotropic etch can be used to remove the (thinner) spacer material deposited onto the vertical surfaces. Suitable materials for the bottom spacer 402 include, but are not limited to, oxide spacer materials such as silicon dioxide ($SiO_2$) and/or silicon carbon oxide (SiCO), and nitride spacer materials such as silicon nitride (SiN), silicon boron carbon nitride (SiBCN), silicon oxycarbon nitride (SiOCN), and/or silicon carbon nitride (SiCN).

Following formation of the bottom source and drain 302 and bottom spacer 402, a gate stack is then formed on the vertical fin channels 202. According to an exemplary embodiment, the gate stack includes a conformal gate dielectric 502 that is deposited onto the vertical fin channels 202, and a conformal gate conductor 504 that is deposited onto the gate dielectric 502. See FIG. 5. In one exemplary embodiment, the conformal gate conductor 504 is a workfunction-setting metal, and the conformal gate dielectric 502 is a high-κ gate dielectric.

The particular workfunction-setting metal employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide).

Suitable high-κ gate dielectrics include, but are not limited to, $HfO_2$ and/or lanthanum oxide ($La_2O_3$).

Figure 6:
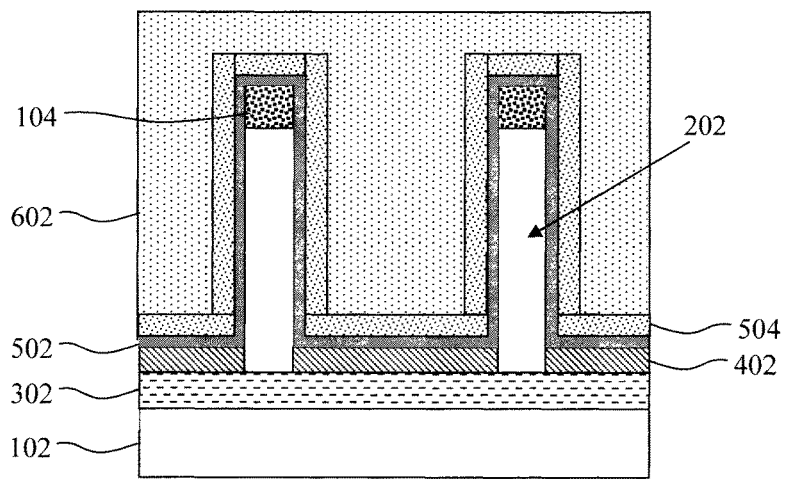
FIG. 6 is a cross-sectional diagram illustrating the vertical fin channels having been buried in a gap fill dielectric according to an embodiment of the present invention.
Figure 7:
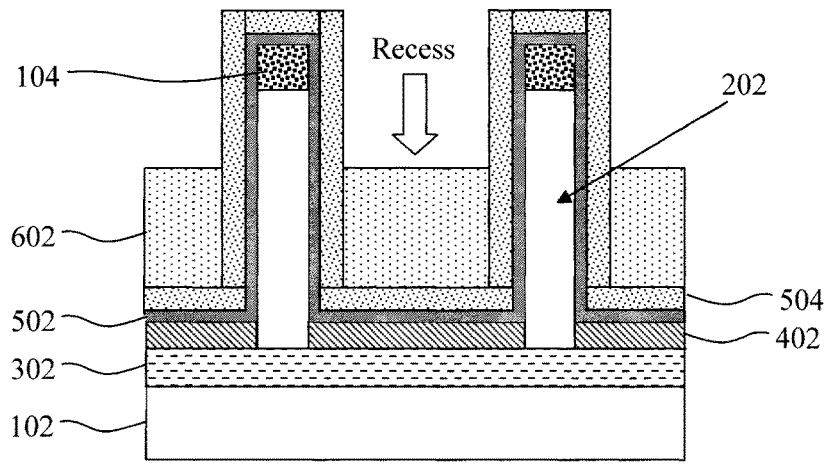
FIG. 7 is a cross-sectional diagram illustrating the gap fill dielectric having been recessed according to an embodiment of the present invention.
Figure 8:
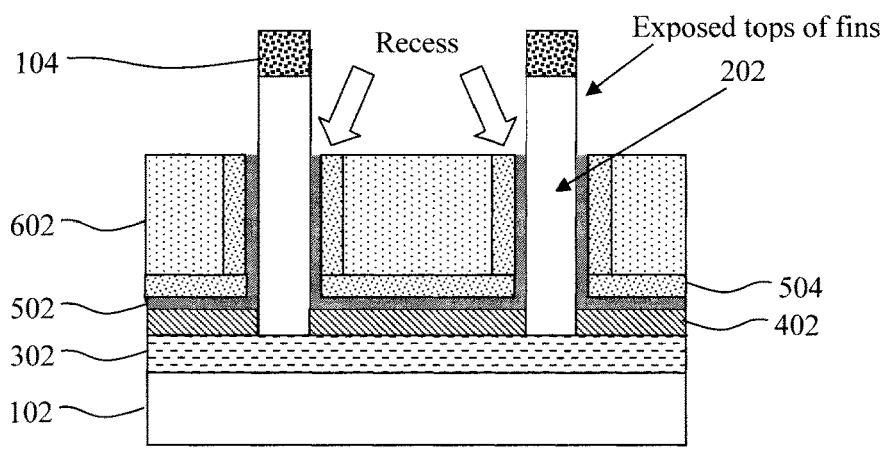
FIG. 8 is a cross-sectional diagram illustrating the gate dielectric and the gate conductor having been recessed to expose a top of each of the vertical fin channels according to an embodiment of the present invention.

The vertical fin channels 202 are then buried in a gap fill dielectric 602. See FIG. 6. As shown in FIG. 6, the gap fill dielectric fills in the spaces between the vertical fin channels 202. According to an exemplary embodiment, the gap fill dielectric 602 is an organic planarizing material such as an aromatic cross-linkable polymer (e.g., naphthalene-based). Other suitable organic planarizing materials are described, for example, in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process," the contents of each of which are incorporated by reference as if fully set forth herein.

Use of the gap fill dielectric 602 enables selective exposure of tops of the vertical fin channels 202. For instance, the gap fill dielectric 602 is next recessed (see FIG. 7), followed by a recess of the gate dielectric 502 and gate conductor 504 (see FIG. 8) which exposes the tops of each of the vertical fin channels 202. The gate dielectric 502 and gate conductor 504 are now present along the sidewalls of the vertical fin channels 202. Following the gate dielectric 502/gate conductor 504 recess, the remaining gap fill dielectric 602 is removed. See FIG. 9.

Figure 9:
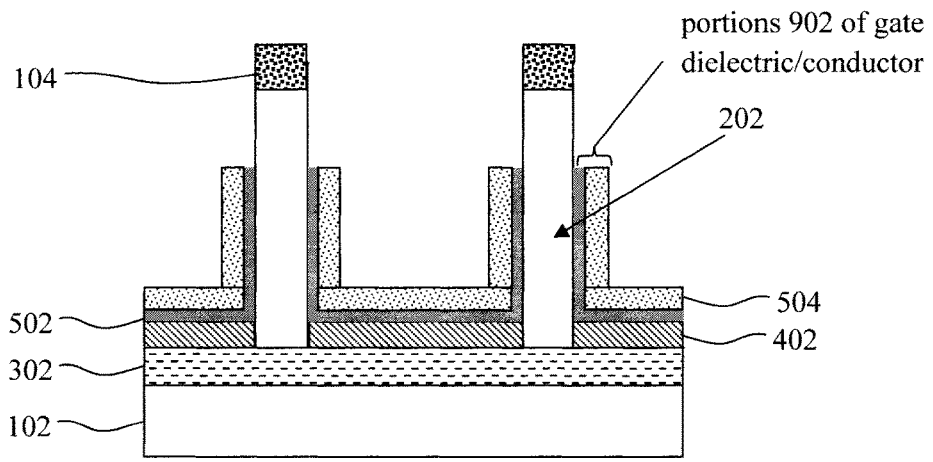
FIG. 9 is a cross-sectional diagram illustrating the remaining gap fill dielectric having been removed according to an embodiment of the present invention.

As shown in FIG. 9, following the recess an area of concern is the end portions 902 of the gate dielectric 502/gate conductor 504 that have now been formed adjacent to the (now exposed) tops of the vertical fin channels 202. Namely, as will be described in detail below, the vertical fin channels 202 will subsequently be covered in a nitride-based encapsulation layer which, along with the (nitride) fin hardmasks 104, is etched to access the tops of the vertical fin channels 202 in order to form the top source and drain epitaxy. With poor selectivity between the encapsulation layer and the fin hardmasks, this etch is likely to expose the end portions 902 of the gate dielectric 502/gate conductor 504. Parasitic growth on these end portions 902 during the top source and drain epitaxy can result in a direct short between the top source and drain and the gate conductor 504.

Thus, the goal here is to selectively provide spacers on top of these end portions 902 of the gate dielectric 502/gate conductor 504 proximal to the tops of the vertical fin channels 202. This selective spacer will act as an underlying etch stop during the etch of the encapsulation layer and fin hardmasks, and remain over and covering the end portions 902 of the gate dielectric 502/gate conductor 504 during the top source and drain epitaxy.

To selectively form the spacers, dielectric spacer material 1002 is deposited onto the vertical fin channels 202 and the end portions 902 of the gate dielectric 502/gate conductor 504. See FIG. 10. In order for the spacers to act as an etch stop, the dielectric spacer material should provide etch selectivity vis-à-vis the encapsulation layer and fin hardmasks. As provided above, the encapsulation layer and fin hardmasks can both be formed from nitride materials. In that case, a suitable dielectric spacer material can include an oxide dielectric material such as $SiO_2$.

Figure 10:
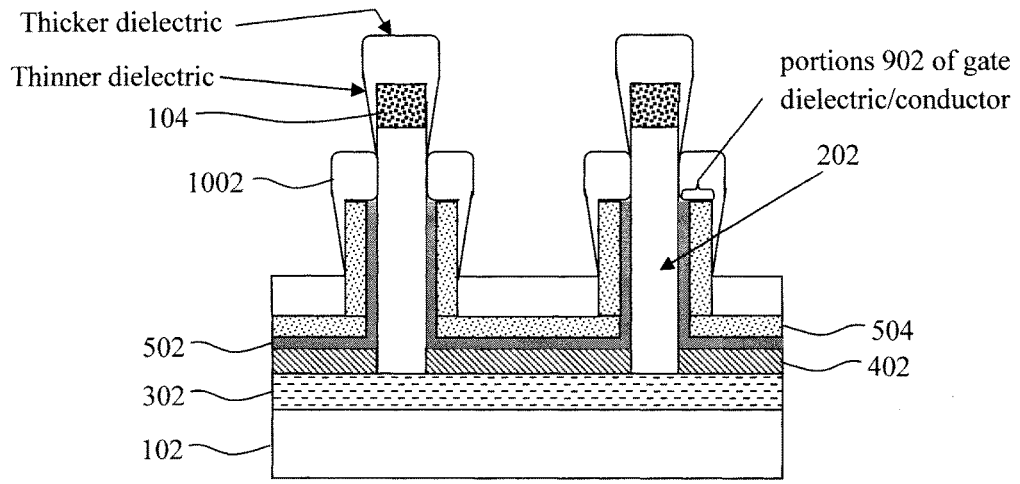
FIG. 10 is a cross-sectional diagram illustrating a dielectric spacer having been deposited onto the vertical fin channels according to an embodiment of the present invention.

As shown in FIG. 10, a directional deposition process (such as HDP CVD or PVD) is also used here to deposit the dielectric spacer material 1002. As with the bottom spacer 402, a directional deposition process will result in a greater amount of the dielectric material 1002 being deposited onto horizontal surfaces, as compared to vertical surfaces. Thus, as shown in FIG. 10, the dielectric spacer material 1002 will be deposited to a greater thickness on the gate conductor 504 in between the vertical fin channels 202, on top of the fins hardmasks 104 and, importantly, on the end portions 902 of the gate dielectric 502/gate conductor 504 as compared to, e.g., on the gate conductor 504 along the sidewalls of the vertical fin channels 202.

Figure 11:
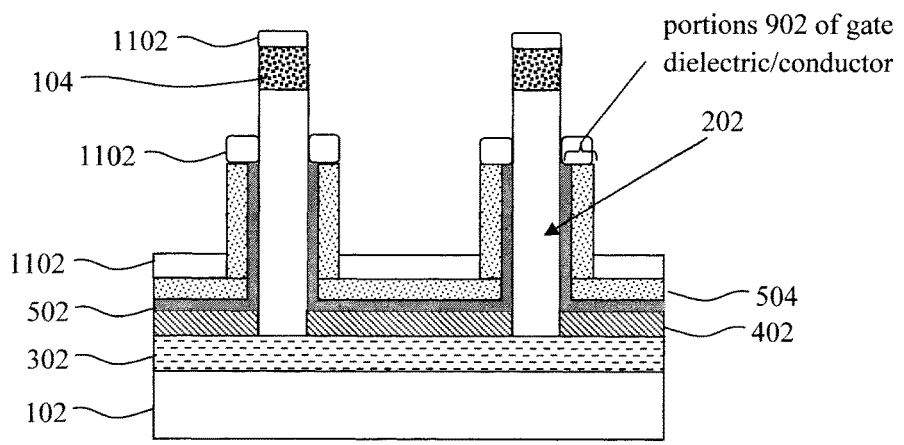
FIG. 11 is a cross-sectional diagram illustrating an etch having been used to remove the dielectric spacer material from vertical surfaces, leaving a dielectric spacer covering portions of the gate dielectric and gate conductor proximal to the tops of the vertical fin channels according to an embodiment of the present invention.

Thus, as shown in FIG. 11, when an (e.g., oxide-selective) isotropic etch is used to remove the dielectric spacer material 1002 from the vertical surfaces, dielectric spacers 1102 will remain selectively covering the end portions 902 of the gate dielectric 502/gate conductor 504. As shown in FIG. 11, this process also forms the dielectric spacers 1102 on the gate conductor 504 in between the vertical fin channels 202, and on top of the fins hardmasks 104.

Figure 12:
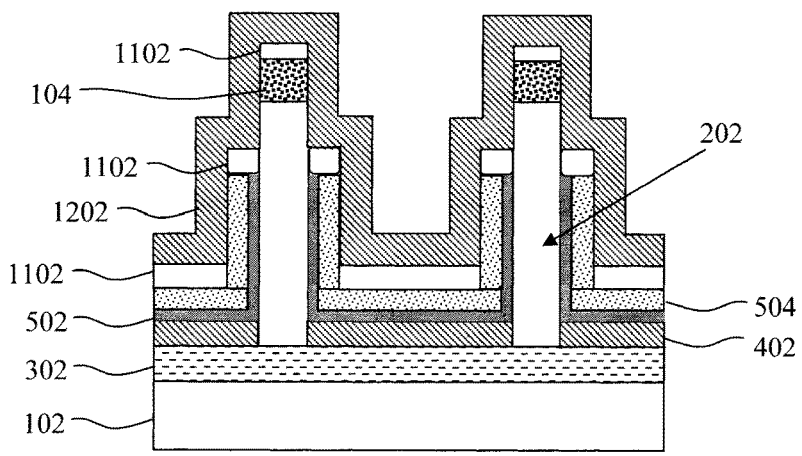
FIG. 12 is a cross-sectional diagram illustrating an encapsulation layer having been deposited onto the vertical fin channels over the dielectric spacers according to an embodiment of the present invention.
Figure 13:
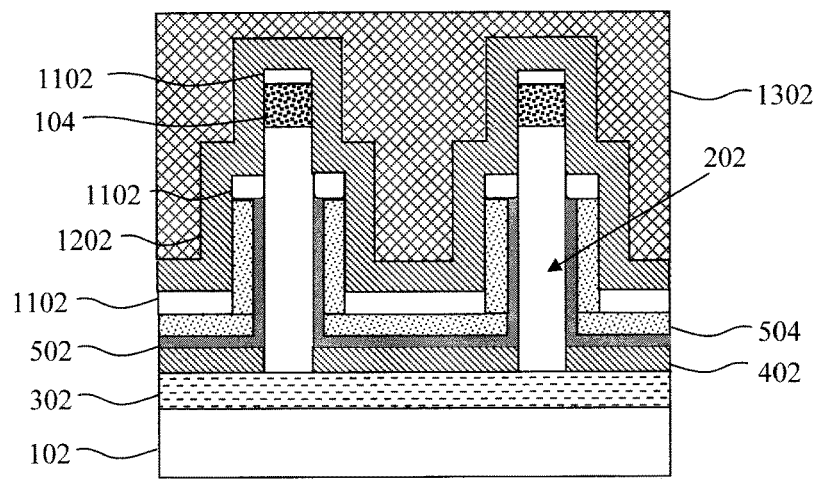
FIG. 13 is a cross-sectional diagram illustrating an oxide fill having been blanket deposited onto the encapsulation layer, filling the spaces in between the vertical fin channels according to an embodiment of the present invention.
Figure 14:
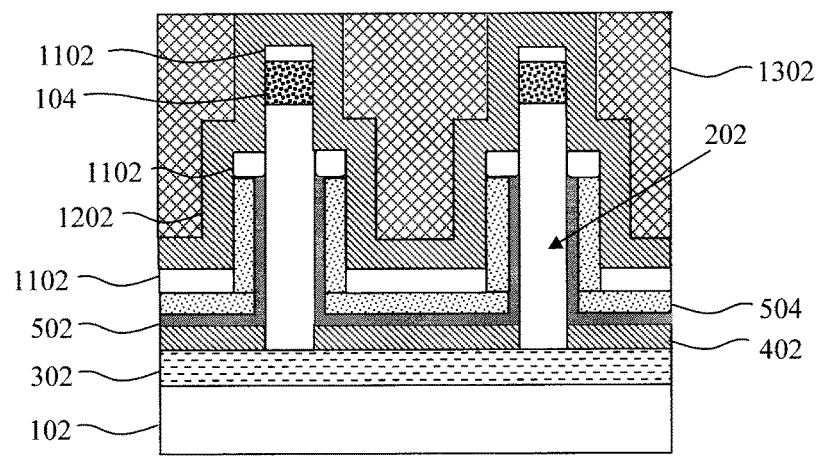
FIG. 14 is a cross-sectional diagram illustrating the oxide fill having been planarized according to an embodiment of the present invention.
Figure 15:
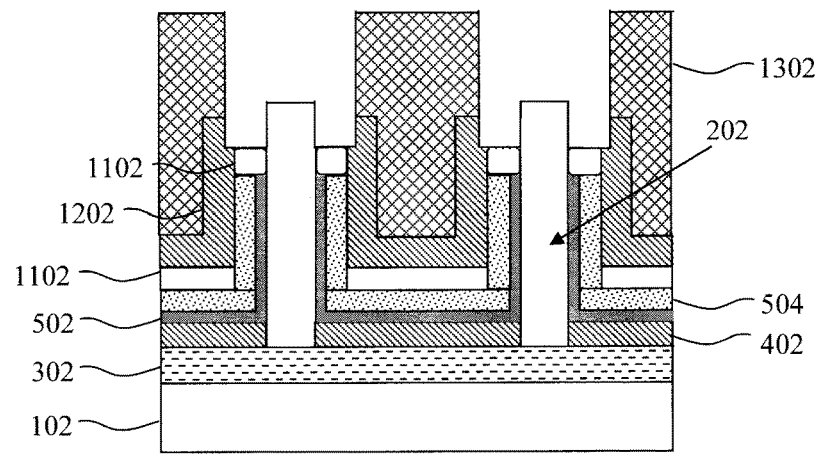
FIG. 15 is a cross-sectional diagram illustrating an etch having been used to remove the encapsulation layer and underlying fins hardmasks at the tops of the vertical fin channels according to an embodiment of the present invention.
Figure 16:
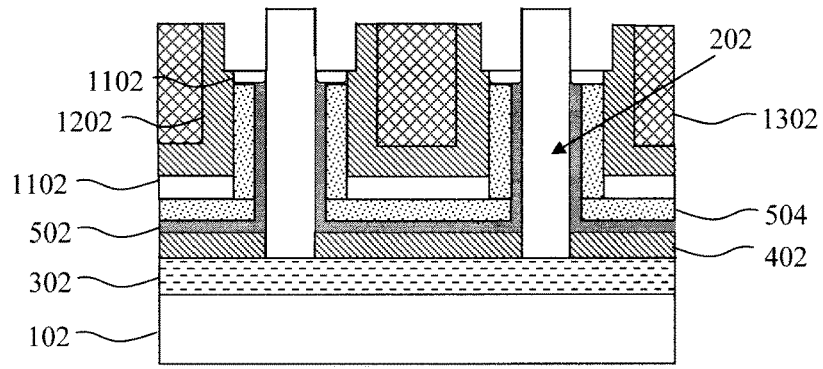
FIG. 16 is a cross-sectional diagram illustrating an epitaxial preclean process having been performed which recesses the dielectric spacers and the oxide fill according to an embodiment of the present invention.
Figure 17:
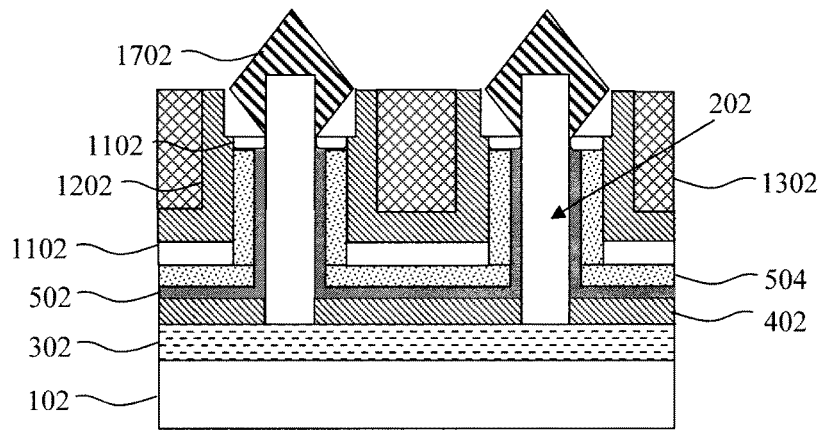
FIG. 17 is a cross-sectional diagram illustrating top source/drains having been formed on the tops of the vertical fin channels according to an embodiment of the present invention.

The above-referenced encapsulation layer (i.e., encapsulation layer 1202) is then deposited onto the vertical fin channels 202 and over the gate dielectric 502/gate conductor 504 and the dielectric spacers 1102. See FIG. 12. As shown in FIG. 12, the encapsulation layer 1202 is a conformal layer. Suitable materials for the encapsulation layer 1202 include, but are not limited to, SiN, SiBCN, SiOCN, SiCO, and/or SiCN. As provided above, the use of an oxide dielectric spacer 1102 provides a suitable etch stop for a nitride encapsulation layer 1202.

An oxide fill 1302 is then blanket deposited over the encapsulation layer 1202, filling the spaces in between the vertical fin channels 202. See FIG. 13. Suitable oxide fill materials include, but are not limited to, $SiO_2$. Use of an oxide fill enables selective removal of the (nitride) fin hardmasks 104 and encapsulation layer 1202 at the tops of the vertical fin channels 202. Namely, the oxide fill 1302 is first polished down to the encapsulation layer 1202, exposing the encapsulation layer 1202 over the tops of the vertical fins channels 202. See FIG. 14. An etch is then used to remove the encapsulation layer 1202, oxide dielectric spacer 1102, and underlying fin hardmasks 104 at the tops of the vertical fin channels 202. See FIG. 15. This etch reveals the tops of the vertical fin channels 202 to enable formation of the top source and drain (see below).

Notably, the (oxide) dielectric spacers 1102 serve as an etch stop during this (nitride-selective) fin reveal etch. As provided above, without such an etch stop portions of the gate dielectric 502/gate conductor 504 adjacent to the tops of the vertical fin channels 202 (i.e., end portions 902—see FIG. 9) can also become exposed and subject to parasitic growth during the top source and drain epitaxy. This parasitic growth is undesirable as it can lead to a short between the gate and the top source/drain.

An epitaxial preclean process is then performed prior to the top source and drain epitaxy. According to an exemplary embodiment, the epitaxial preclean is performed using hydrofluoric (HF) acid or a plasma assisted chemical dry etch. See, for example, U.S. Patent Application Publication Number 20170025305 A1 by Cheng et al., entitled "Shallow Trench Isolation Regions Made from Crystalline Oxides," the contents of which are incorporated by reference as if fully set forth herein. These epitaxial preclean processes remove native oxides and thereby recess the (oxide) dielectric spacers 1102 and the oxide fill 1302. See FIG. 16.

Top source and drains 1702 are then formed on the (now exposed) tops of the vertical fin channels 202. See FIG. 17. According to an exemplary embodiment, the top source/drains 1702 are formed from an in-situ (i.e., during growth)

or ex-situ (e.g., via implantation) doped epitaxial material such as epitaxial Si, SiGe, etc. As provided above, suitable n-type dopants include, but are not limited to, phosphorous (P) and arsenic (As), and suitable p-type dopants include, but are not limited to, boron (B).

Figure 18:
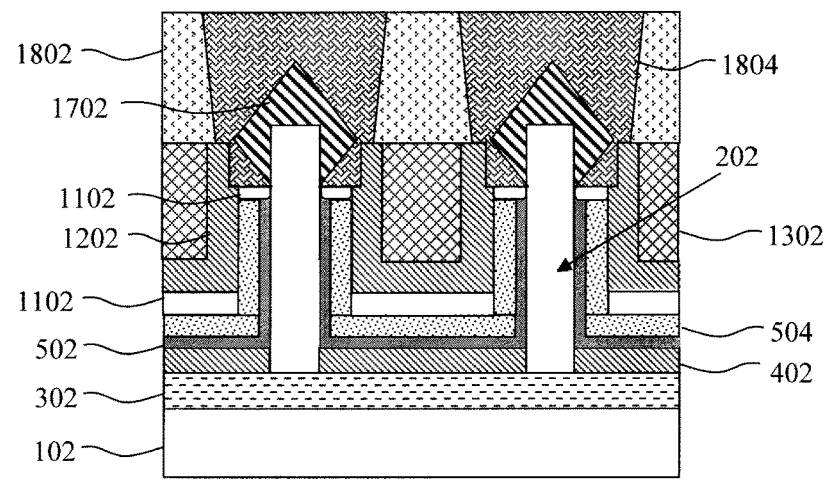
FIG. 18 is a cross-sectional diagram illustrating contacts having been formed to the top source/drains according to an embodiment of the present invention.

Additional steps to complete the device can then be performed, such as top contact metallization. See FIG. 18. As shown in FIG. 18, an interlayer dielectric (ILD) 1802 is blanket deposited onto the device over the top source/drains 1702, the ILD 1802 is patterned with the footprint and location of one or more contacts, and the pattern is then filled with a contact metal (such as copper (Cu), tungsten (W), titanium (Ti) and/or platinum (Pt)) to form contacts 1804 to the top source/drains 1702.

As described above in accordance with the first exemplary embodiment, forming the dielectric spacers 1102 involves depositing the (oxide) dielectric spacer material 1002 onto the gate conductor 504. There may however be concerns about oxygen contaminating a metal gate conductor 504. Thus, according to another exemplary embodiment, a metal protection layer, i.e., a layer that protects the metal gate, is inserted between the gate conductor and the dielectric spacer material. This will result in the formation of a dual spacer design that, in the same manner as described, isolates the gate dielectric/gate conductor from parasitic growth during the top source and drain epitaxy. This dual spacer design provides the added benefit of also protecting the underlying gate conductor from oxide contamination.

Figure 19:
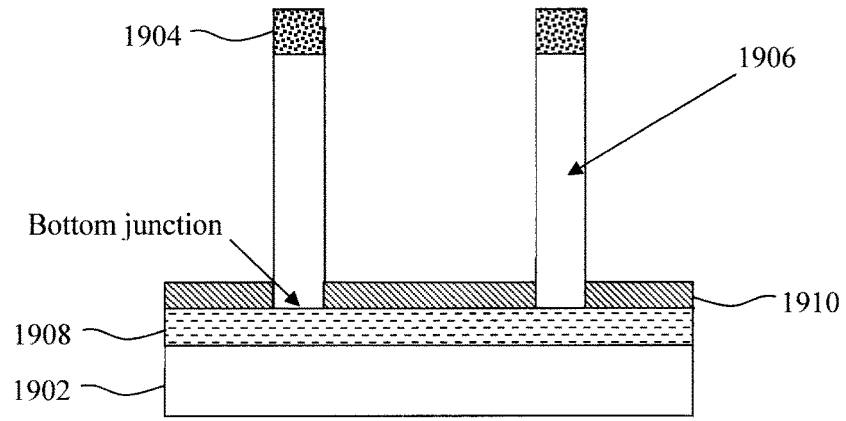
FIG. 19 is a cross-sectional diagram illustrating fin hardmasks having been used to pattern a plurality of vertical fin channels in a substrate, a bottom source and drain having been formed in the substrate beneath the vertical fin channels, and a bottom spacer having been formed on the bottom source and drain in between the vertical fin channels according to an embodiment of the present invention.
Figure 20:
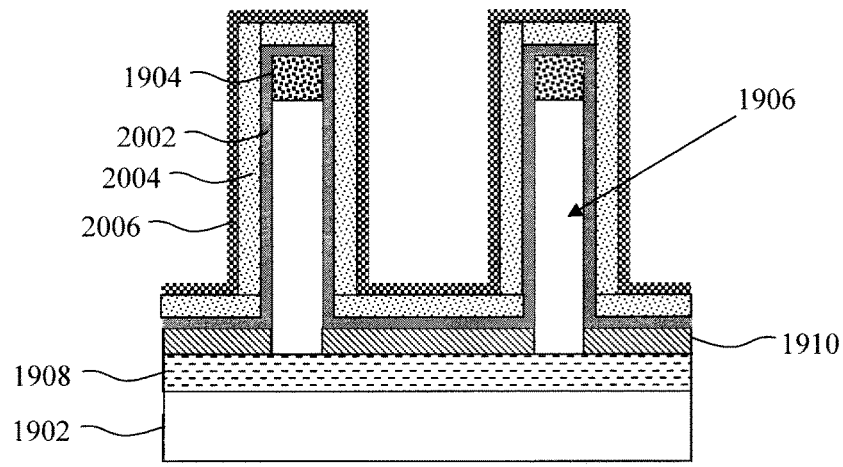
FIG. 20 is a cross-sectional diagram illustrating a conformal gate dielectric material having been deposited onto the vertical fin channel, followed by a conformal gate conductor, and a conformal metal protection layer having been deposited onto the gate conductor according to an embodiment of the present invention.

This dual spacer embodiment is now described by way of reference to FIGS. 19-31. The process begins in the same general manner as the preceding embodiment, whereby a plurality of fin hardmasks 1904 are formed on an undoped (bulk or SOI) Si substrate 1902, and then used to pattern a plurality of vertical fin channels 1906 that extend partway through the substrate 1902 (i.e., a portion of the substrate 1902 remains below the vertical fin channels 1906). A bottom source and drain 1908 is then formed in the substrate 1902 beneath the vertical fin channels 1906. As provided above, formation of the bottom source and drain creates a bottom junction between the bottom source and drain 1908 and the vertical fin channels 1906. Suitable n-type and p-type source and drain dopants were provided above. A bottom spacer 1910 (e.g., $SiO_2$, SiN, SiBCN, SiOCN, SiCO and/or SiCN) is then formed (by directional deposition) on the bottom source and drain 1908 in between the vertical fin channels 1906. See FIG. 19.

In the same manner as described above, a conformal gate dielectric material 2002 is next deposited onto the vertical fin channel 1906, followed by a conformal gate conductor 2004. According to an exemplary embodiment, the gate conductor 2004 includes a workfunction-setting metal and the gate dielectric includes a high-κ gate dielectric. As provided above, suitable n-type workfunction setting metals include, but are not limited to, TiN, TaN and/or Al-containing alloys such as TiAl, TiAlN, TiAlC, TaAl, TaAlN, and/or TaAlC. Suitable p-type workfunction setting metals include, but are not limited to, TiN, TaN, and W. Suitable high-κ gate dielectrics include, but are not limited to, $HfO_2$ and/or $La_2O_3$.

However, in this embodiment, a conformal metal protection layer 2006 is next deposited onto the gate conductor 2004. As provided above, the metal protection layer 2006 protects the gate conductor 2004 during the subsequent deposition of the dielectric spacer material (which along with the metal protection layer 2006 forms the dual spacer). Suitable materials for the metal protection layer 2006 include, but are not limited to, SiN, SiBCN, SiOCN, SiCO and/or SiCN.

Figure 21:
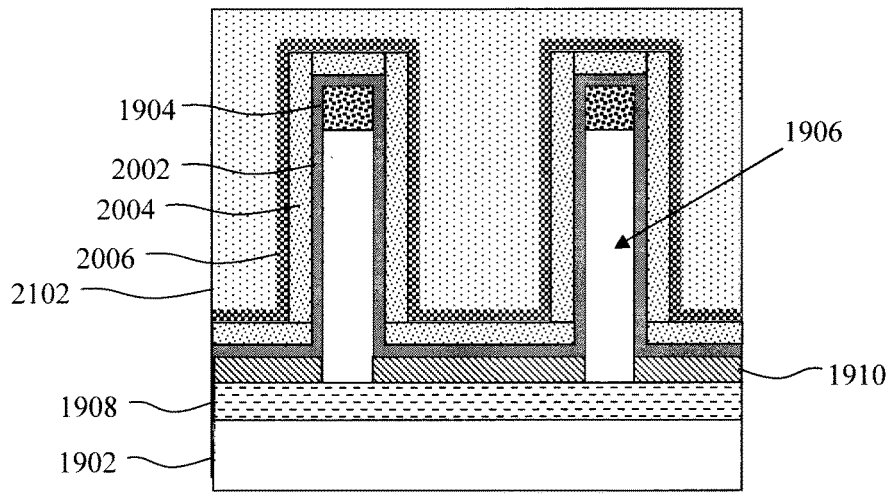
FIG. 21 is a cross-sectional diagram illustrating the vertical fin channels having been buried in a gap fill dielectric according to an embodiment of the present invention.
Figure 22:
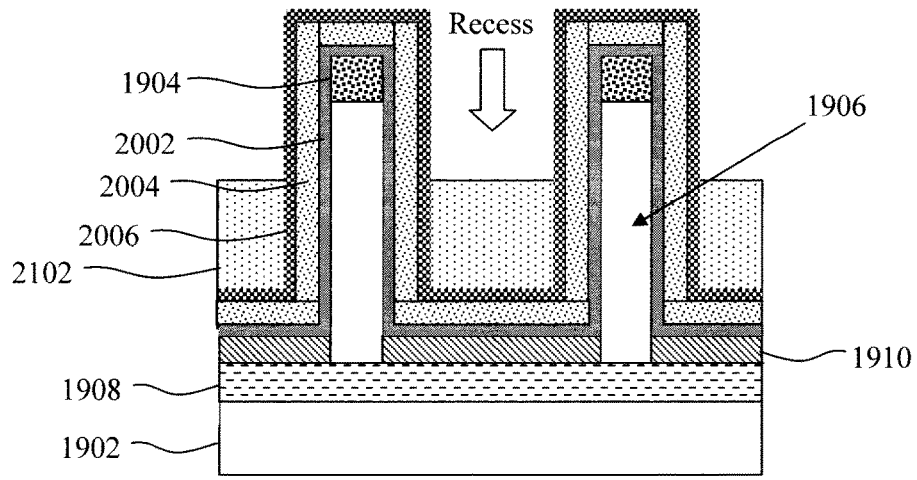
FIG. 22 is a cross-sectional diagram illustrating the gap fill dielectric having been recessed according to an embodiment of the present invention.
Figure 23:
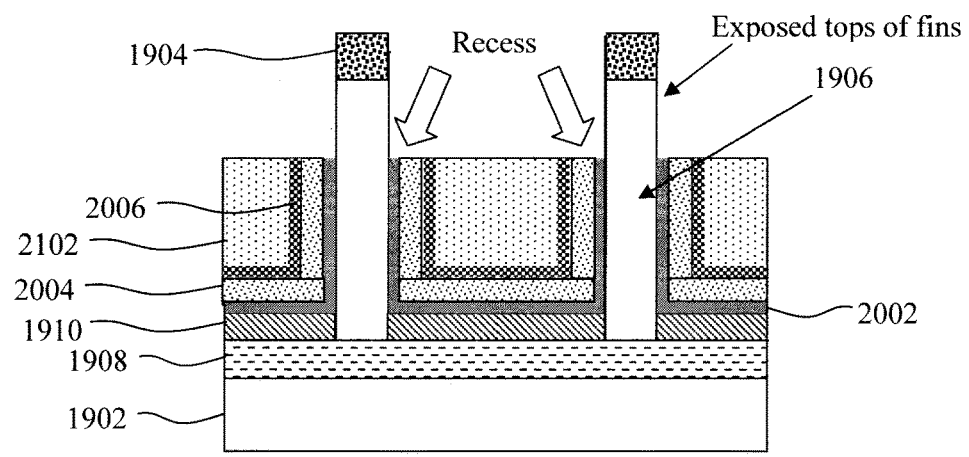
FIG. 23 is a cross-sectional diagram illustrating the gate dielectric, the gate conductor, and the metal protection layer having been recessed to expose a top of each of the vertical fin channels according to an embodiment of the present invention.

With the metal protection layer 2006 in place, the remainder of the process follows the same flow as above. Namely, as shown in FIG. 21, the vertical fin channels 1906 are then buried in a gap fill dielectric 2102 (e.g., an organic planarizing material) that fills in the spaces between the vertical fin channels 1906. Suitable organic planarizing materials were provided above.

The gap fill dielectric 2102 is then recessed (see FIG. 22), followed by a recess of the gate dielectric 2002, gate conductor 2004 and metal protection layer 2006 (see FIG. 23) which exposes the tops of the vertical fin channels 1906. The gate dielectric 2002, gate conductor 2004, and metal protection layer 2006 are now present along the sidewalls of the vertical fin channels 1906. Following the gate dielectric 2002/gate conductor 2004/metal protection layer 2006 recess, the remaining gap fill dielectric 2102 is removed. See FIG. 24.

Figure 24:
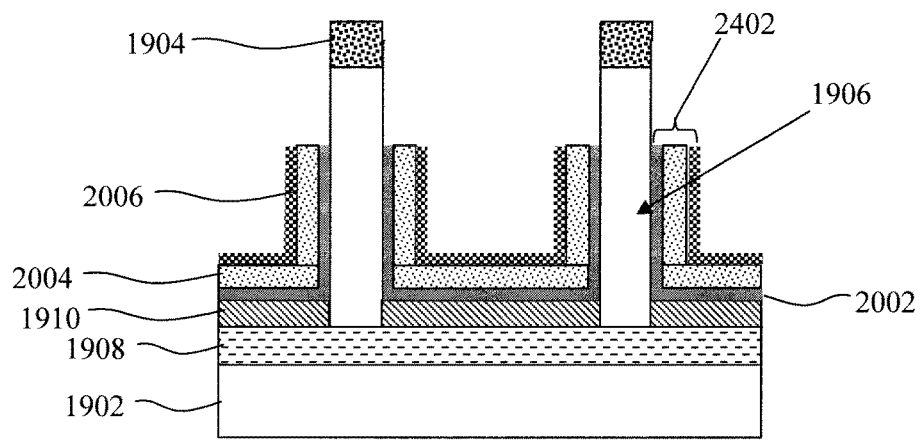
FIG. 24 is a cross-sectional diagram illustrating the remaining gap fill dielectric having been removed according to an embodiment of the present invention.

As shown in FIG. 24, the recess forms end portions 2402 of the gate dielectric 2002/gate conductor 2004 adjacent to the tops of the vertical fin channels 1906. As above, the goal is to provide spacers (in this case a dual spacer) on top of these end portion 2402 to act as an etch stop during removal of an encapsulation layer and the fin hardmasks 1904 for top source and drain formation.

The first component of the dual spacer is the metal protection layer 2006. To form the second component of the dual spacer, a dielectric spacer material 2502 is next deposited onto the vertical fin channels 1906 and the end portions 2402 of the gate dielectric 2002/gate conductor 2004, and over the metal protection layer 2006. See FIG. 25. By way of example only, an oxide dielectric spacer material 2502 such as $SiO_2$ provides etch selectivity to the nitride fin hardmasks and encapsulation layer.

Figure 25:
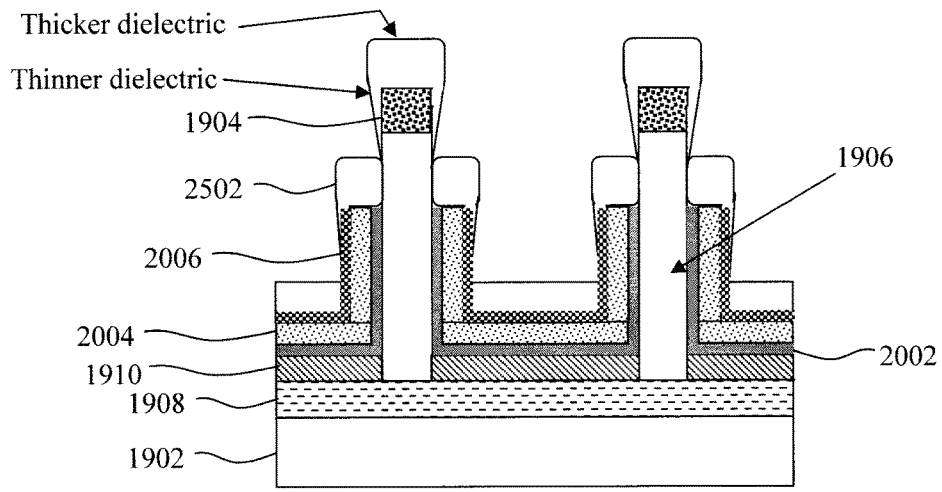
FIG. 25 is a cross-sectional diagram illustrating a dielectric spacer material having been deposited onto the vertical fin channels and over the metal protection layer according to an embodiment of the present invention.

As above, a directional deposition process (such as HDP CVD or PVD) is also used here to deposit the dielectric spacer material 2502 which, as shown in FIG. 25, results in a greater amount of the dielectric material 2502 being deposited onto horizontal surfaces, as compared to vertical surfaces. Thus, as shown in FIG. 25, the dielectric spacer material 2502 will be deposited to a greater thickness on the metal protection layer 2006 in between the vertical fin channels 1906, on top of the fins hardmasks 1904 and, importantly, on the end portions 2402 of the gate dielectric 2002/gate conductor 2004 as compared to, e.g., on the metal protection layer 2006 along the sidewalls of the vertical fin channels 1906.

Figure 26:
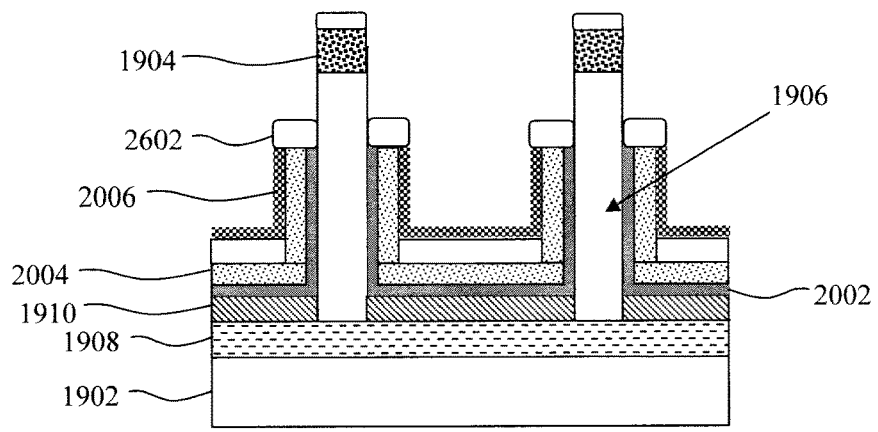
FIG. 26 is a cross-sectional diagram illustrating an etch having been used to remove the dielectric spacer material from vertical surfaces, leaving a dielectric spacer covering portions of the gate dielectric and gate conductor proximal to the tops of the vertical fin channels according to an embodiment of the present invention.
Figure 27:
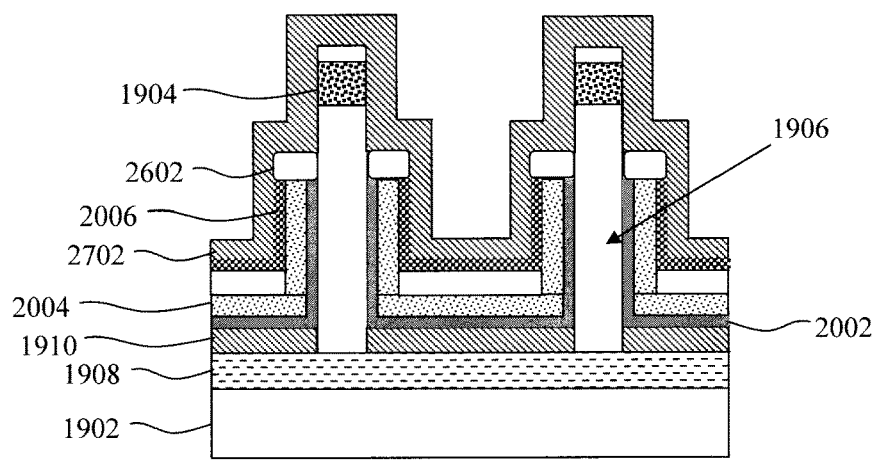
FIG. 27 is a cross-sectional diagram illustrating an encapsulation layer having been deposited onto the vertical fin channels over the dielectric spacer/metal protection layer dual spacer according to an embodiment of the present invention.
Figure 28:
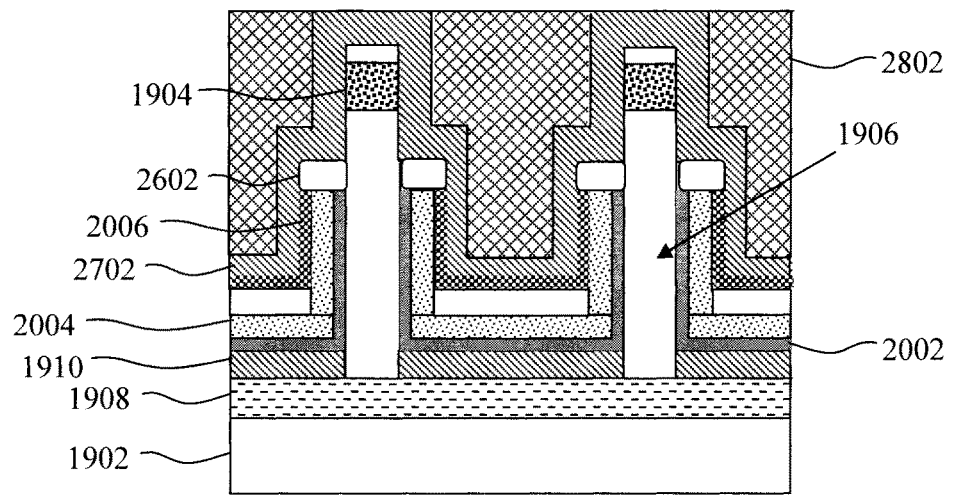
FIG. 28 is a cross-sectional diagram illustrating an oxide fill having been blanket deposited onto the encapsulation layer, filling the spaces in between the vertical fin channels, and then polished down to the encapsulation layer according to an embodiment of the present invention.
Figure 29:
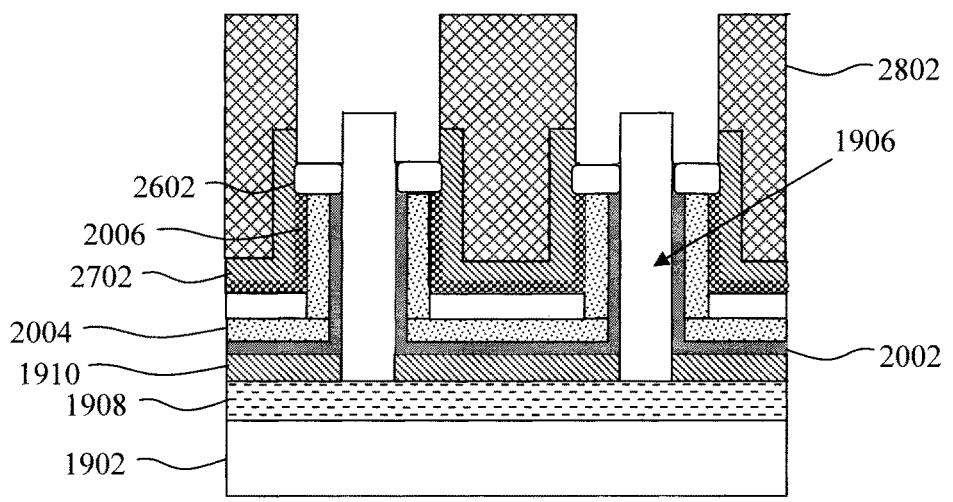
FIG. 29 is a cross-sectional diagram illustrating an etch having been used to remove the encapsulation layer and underlying fins hardmasks at the tops of the vertical fin channels according to an embodiment of the present invention.

Thus, as shown in FIG. 26, when an (e.g., oxide-selective) isotropic etch is used to remove the dielectric spacer material 2502 from the vertical surfaces, dielectric spacers 2602 will remain covering the end portions 2402 of the gate dielectric 2002/gate conductor 2004. As shown in FIG. 26, this process also forms the dielectric spacers 2602 on the metal protection layer 2006 in between the vertical fin channels 1906, and on top of the fins hardmasks 1904. The combination of i) the dielectric spacer 2602 covering the gate dielectric 2002/gate conductor 2004 adjacent to the tops of the vertical fin channels 1906 and ii) the metal protection layer 2006 covering the gate conductor 2004 is what is referred to herein as the dual spacer in the present design.

A conformal encapsulation layer 2702 is then deposited onto the vertical fin channels 1906 and over the gate dielectric 2002/gate conductor 2004, the dielectric spacer 2602/metal protection layer 2006 dual spacer. See FIG. 27. As provided above, suitable encapsulation layer materials include, but are not limited to, nitride materials such as SiN, SiBCN, SiOCN, SiCO, and/or SiCN. Notably, an oxide dielectric spacer 2602 provides a suitable etch stop for a nitride encapsulation layer 2702.

An oxide fill 2802 (e.g., $SiO_2$) is then blanket deposited over the encapsulation layer 2702, filling the spaces in between the vertical fin channels 1906, and then polished down to the encapsulation layer 2702, exposing the encapsulation layer 2702 over the tops of the vertical fins channels 1906. See FIG. 28. As provided above, use of an oxide fill enables selective removal of the (nitride) fin hardmasks 1904 and encapsulation layer 2702 at the tops of the vertical fin channels 1906. Namely, an etch is then used to remove the encapsulation layer 2702, the dielectric spacer 2602, and underlying fins hardmasks 1904 at the tops of the vertical fin channels 1906. See FIG. 29. This etch reveals the tops of the vertical fin channels 1906 for the formation of the top source and drain (see below).

Advantageously, the (oxide) dielectric spacer 2602 serve as an etch stop during this (nitride-selective) fin reveal etch. Without such an etch stop, portions of the gate dielectric 2002/gate conductor 2004 adjacent to the tops of the vertical fin channels 1906 (i.e., portions 2402—see FIG. 24) can become exposed and see parasitic growth during the top source and drain epitaxy, which is undesirable as it can lead to a short between the gate and the top source and drain.

Figure 30:
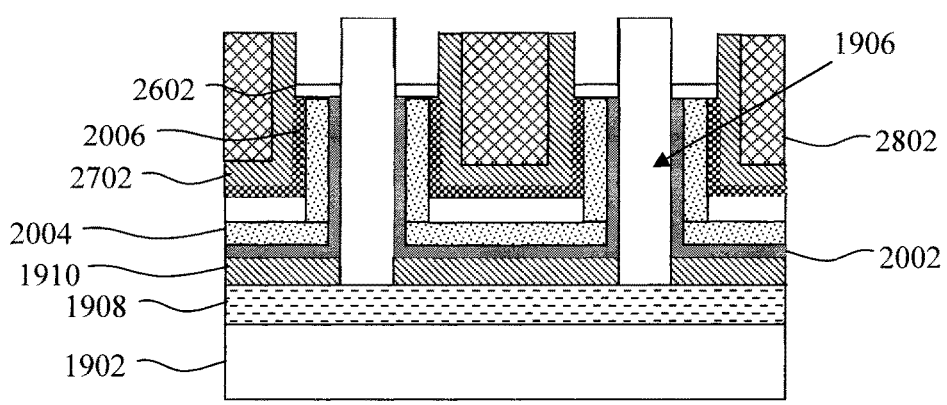
FIG. 30 is a cross-sectional diagram illustrating an epitaxial preclean process having been performed which recesses the dielectric spacers and the oxide fill according to an embodiment of the present invention.

An epitaxial preclean process (using, e.g., HF or a plasma assisted chemical dry etch) is then performed prior to the top source and drain epitaxy. As shown in FIG. 30, this preclean process recesses the (oxide) dielectric spacer 2602 and the oxide fill 2802.

Figure 31:
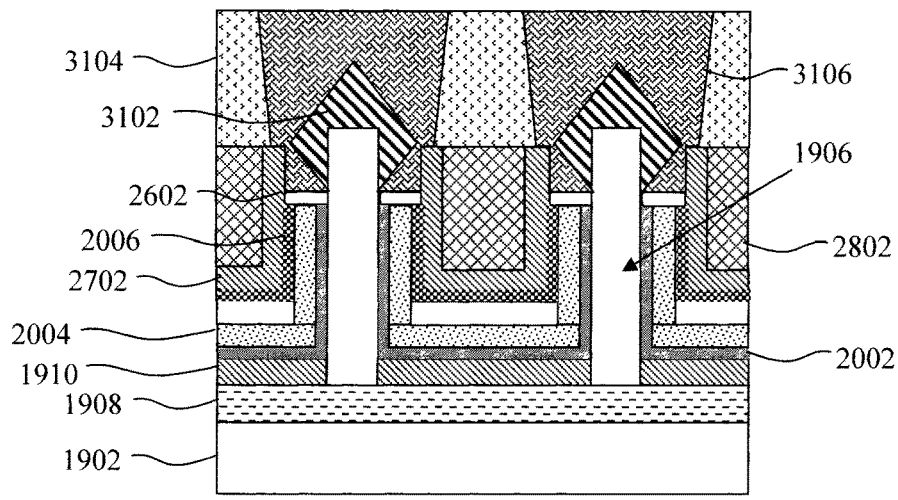
FIG. 31 is a cross-sectional diagram illustrating top source/drains having been formed on the tops of the vertical fin channels, and contacts having been formed to the top source/drains according to an embodiment of the present invention.

Top source/drains 3102 are then formed on the (now exposed) tops of the vertical fin channels 1906. See FIG. 31. According to an exemplary embodiment, the top source/drains 3102 are formed from an in-situ or ex-situ (n-type or p-type) doped epitaxial material such as epitaxial Si, SiGe, etc. As shown in FIG. 31, following formation of the top source/drains 3102, an ILD 3104 is then blanket deposited onto the device over the top source/drains 3102, the ILD 3104 is patterned with the footprint and location of one or more contacts, and the pattern is then filled with a contact metal (such as Cu, W, Ti and/or Pt to form contacts 3106 to the top source/drains 3102.

In the exemplary embodiment just described, the added benefit of a metal protection layer 2006 is provided to shield the (metal) gate conductor 2004 from oxidation during processing. However, according to that process flow, the dielectric spacer 2602 is still in direct contact with the end portions 2402 of the gate conductor 2004 adjacent to the tops of the vertical fin channels 1906 (compare FIG. 24 and FIG. 26), i.e., the metal protection layer 2006 does not encapsulate all of the exposed surfaces of the gate conductor 2004. But if the gate dielectric 2002/gate conductor 2004 recess is performed prior to placing the metal protection layer (as compared to placing the gate dielectric, gate conductor, and metal protection layer prior to recess—see above), then all exposed surfaces of the (recessed) gate conductor 2004 will advantageously be covered by the metal protection layer. This exemplary alternative process flow involving a metal protection layer is now described by way of reference to FIGS. 32-45.

The process begins in the same general manner as the preceding embodiments, whereby a plurality of fin hardmasks 3204 are formed on an undoped (bulk or SOI) Si substrate 3202, and then used to pattern a plurality of vertical fin channels 3206 that extend partway through the substrate 3202 (i.e., a portion of the substrate 3202 remains below the vertical fin channels 3206). A bottom source and drain 3208 is then formed in the substrate 3202 beneath the vertical fin channels 3206. Suitable n-type and p-type source and drain dopants were provided above. A bottom spacer 3210 (e.g., $SiO_2$, SiN, SiBCN, SiOCN, SiCO, and/or SiCN) is then formed (by directional deposition) on the bottom source and drain 3208 in between the vertical fin channels 3206. See FIG. 32.

In the same manner as described above, a conformal gate dielectric material 3212 is next deposited onto the vertical fin channel 3206, followed by a conformal gate conductor 3214. According to an exemplary embodiment, the gate conductor 3214 includes a workfunction-setting metal and the gate dielectric includes a high-κ gate dielectric. As provided above, suitable n-type workfunction setting metals include, but are not limited to, TiN, TaN and/or Al-containing alloys such as TiAl, TiAlN, TiAlC, TaAl, TaAlN, and/or TaAlC. Suitable p-type workfunction setting metals include, but are not limited to, TiN, TaN, and W. Suitable high-κ gate dielectrics include, but are not limited to, $HfO_2$ and/or $La_2O_3$.

Figure 32:
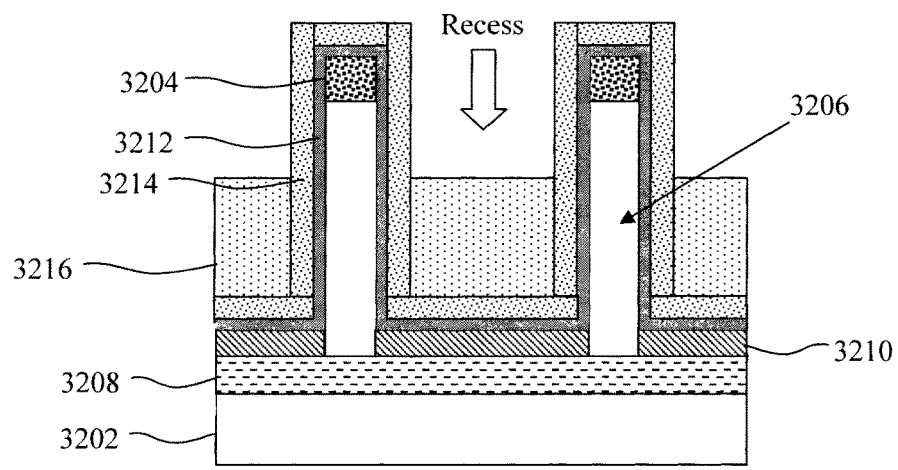
FIG. 32 is a cross-sectional diagram illustrating a plurality of vertical fin channels patterned in a substrate, a bottom source and drain having been formed beneath the vertical fin channels, a bottom spacer having been formed on the bottom source/drain, a conformal gate dielectric material and a conformal gate conductor having been deposited onto the vertical fin channel, the vertical fin channels having been buried in a gap fill dielectric which is then recessed according to an embodiment of the present invention.
Figure 33:
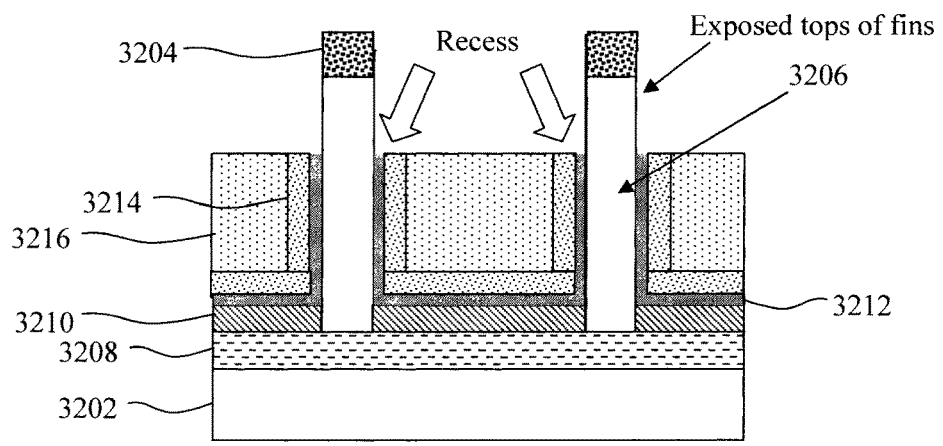
FIG. 33 is a cross-sectional diagram illustrating the gate dielectric and the gate conductor having been recessed to expose a top of each of the vertical fin channels according to an embodiment of the present invention.

In this example, the gate dielectric 3212 and the gate conductor 3214 are recessed prior to placing the metal protection layer. Namely, as shown in FIG. 32 the vertical fin channels 3206 are then buried in a gap fill dielectric 3216 (e.g., an organic planarizing material) that fills in the spaces between the vertical fin channels 3206. Suitable organic planarizing materials were provided above.

Figure 34:
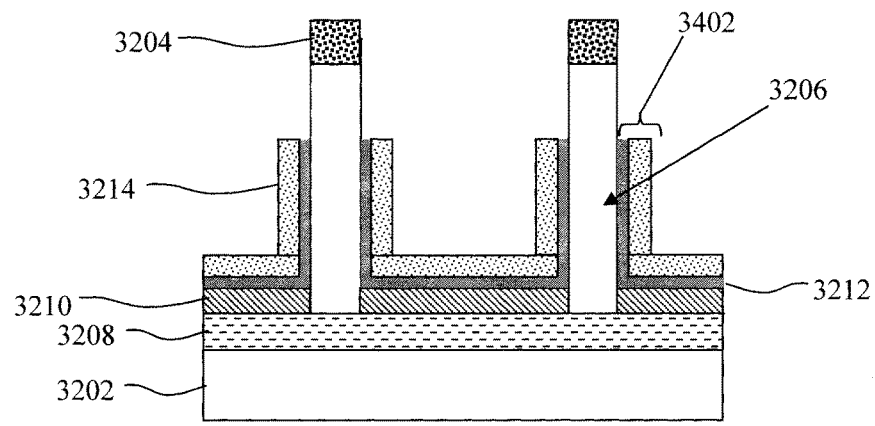
FIG. 34 is a cross-sectional diagram illustrating the remaining gap fill dielectric having been removed according to an embodiment of the present invention.
Figure 35:
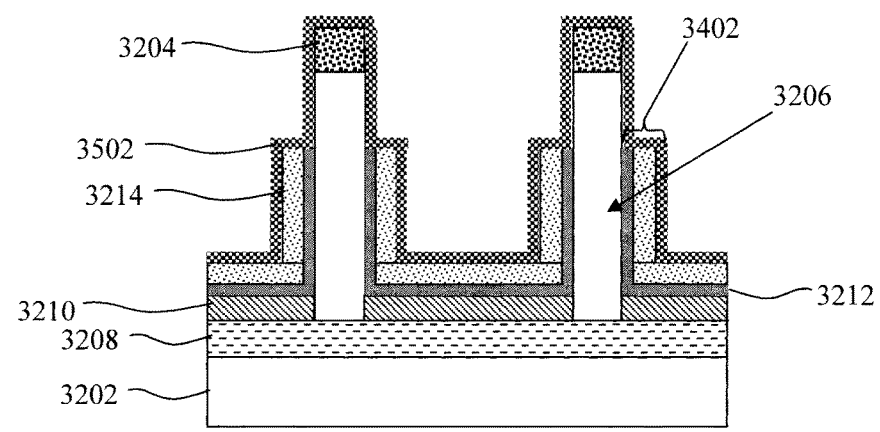
FIG. 35 is a cross-sectional diagram illustrating a conformal metal protection layer having been deposited onto the vertical fin channels over the gate dielectric and gate conductor according to an embodiment of the present invention.
Figure 36:
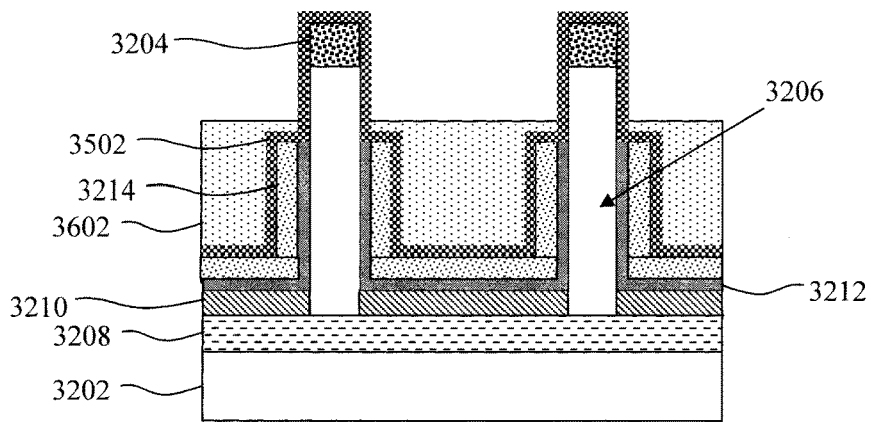
FIG. 36 is a cross-sectional diagram illustrating a gap fill dielectric having been blanket deposited onto the structure and then recessed to expose a portion of the metal protection layer covering the tops of each of the vertical fin channels according to an embodiment of the present invention.
Figure 37:
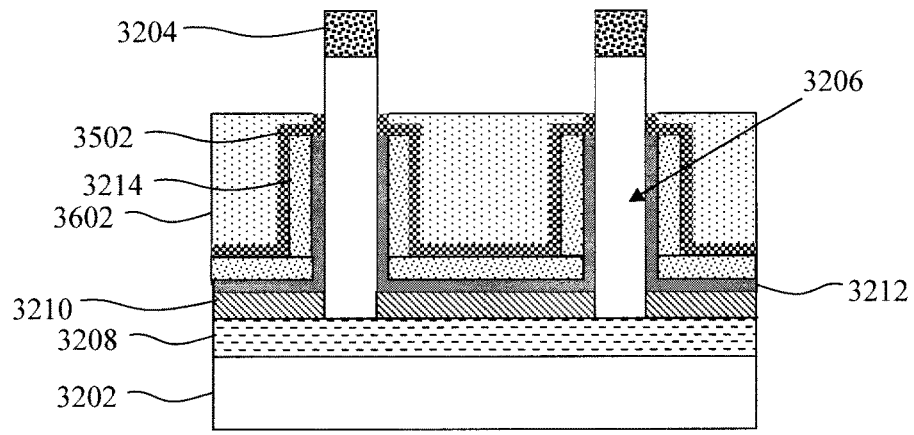
FIG. 37 is a cross-sectional diagram illustrating the metal protection layer having been recessed to expose the tops of each of the vertical fin channels according to an embodiment of the present invention.
Figure 38:
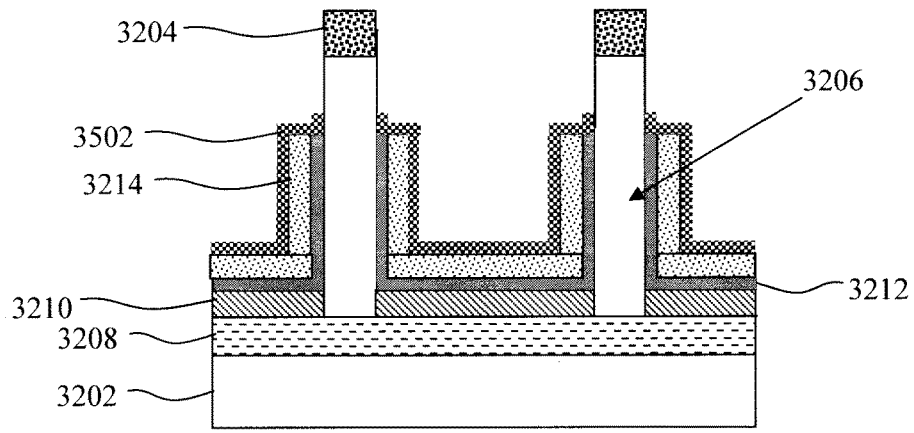
FIG. 38 is a cross-sectional diagram illustrating the remaining gap fill dielectric having been removed according to an embodiment of the present invention.

The gap fill dielectric 3216 is then recessed (see FIG. 32), followed by a recess of the gate dielectric 3212 and gate conductor 3214 (see FIG. 33) which exposes the tops of the vertical fin channels 3206. The gate dielectric 3212 and gate conductor 3214 are now present along the sidewalls of the vertical fin channels 3206. Following the gate dielectric 3212/gate conductor 3214 recess, the remaining gap fill dielectric 3216 is removed. See FIG. 34. As shown in FIG. 34, the recess results in end portions 3402 of the gate dielectric 3212/gate conductor 3214 being adjacent to the tops of the vertical fin channels 3206.

Depositing a metal protection layer 3502 at this point in the process will ensure complete coverage of the metal protection layer 3502 over all of the exposed surfaces of the gate conductor 3214, including the end portions 3402 formed by the recess etch. See FIG. 35. As provided above, the metal protection layer 3502 protects the gate conductor 3214 during the subsequent deposition of the dielectric spacer material (which along with the metal protection layer 3502 forms the dual spacer). Suitable materials for the metal protection layer 3502 include, but are not limited to, SiN, SiBCN, SiOCN, SiCO and/or SiCN.

A separate recess etch of the metal protection layer 3502 is however needed to expose the tops of the vertical fin channels 3206. Namely, a gap fill dielectric 3602 (e.g., an organic planarizing material) is blanket deposited onto the structure filling the spaces between the vertical fin channels 3206. The gap fill dielectric 3602 is then recessed to expose a portion of the metal protection layer 3502 covering the tops of each of the vertical fin channels 3206. See FIG. 36. The metal protection layer 3502 is then recessed to expose the tops of each of the vertical fin channels 3206 (see FIG. 37) and the remaining gap fill dielectric 3602 is removed (see FIG. 38).

The metal protection layer 3502 is the first component of the dual spacer. To form the second component of the dual spacer, a dielectric spacer material 3902 is next deposited onto the vertical fin channels 3206 and the end portions 3402 of the gate dielectric 3212/gate conductor 3214, and over the metal protection layer 3502. See FIG. 39. By way of example only, an oxide dielectric spacer material 3902 such as SiO$_2$ provides etch selectivity to the nitride fin hardmasks and encapsulation layer.

Figure 39:
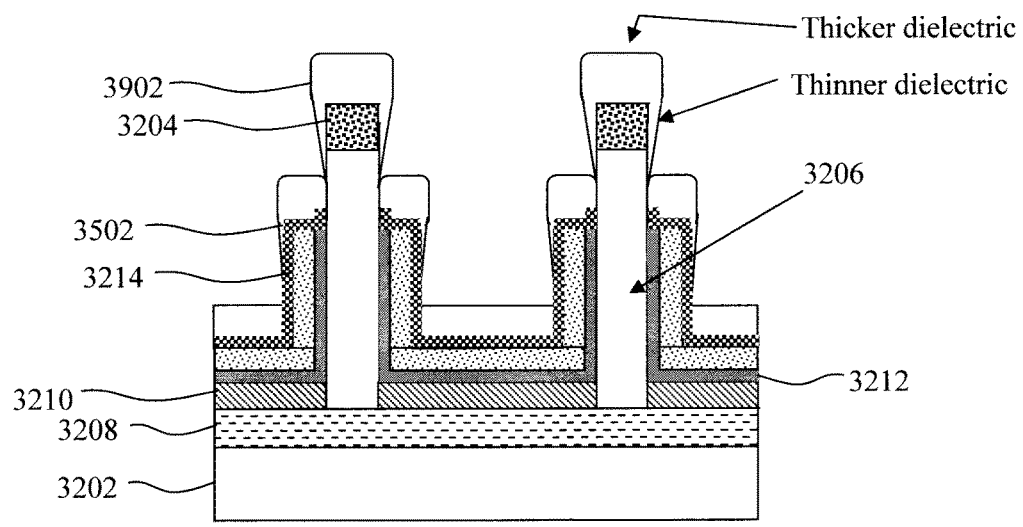
FIG. 39 is a cross-sectional diagram illustrating a dielectric spacer material having been deposited onto the vertical fin channels and over the metal protection layer according to an embodiment of the present invention.

As above, a directional deposition process (such as HDP CVD or PVD) is also employed here to deposit the dielectric spacer material 3902 which, as shown in FIG. 39, results in a greater amount of the dielectric material 3902 being deposited onto horizontal surfaces, as compared to vertical surfaces. Thus, as shown in FIG. 39, the dielectric spacer material 3902 will be deposited to a greater thickness on the metal protection layer 3502 in between the vertical fin channels 3206, on top of the fins hardmasks 3204 and, importantly, on the end portions 3402 of the gate dielectric 3212/gate conductor 3214 as compared to, e.g., on the metal protection layer 3502 along the sidewalls of the vertical fin channels 3206.

Figure 40:
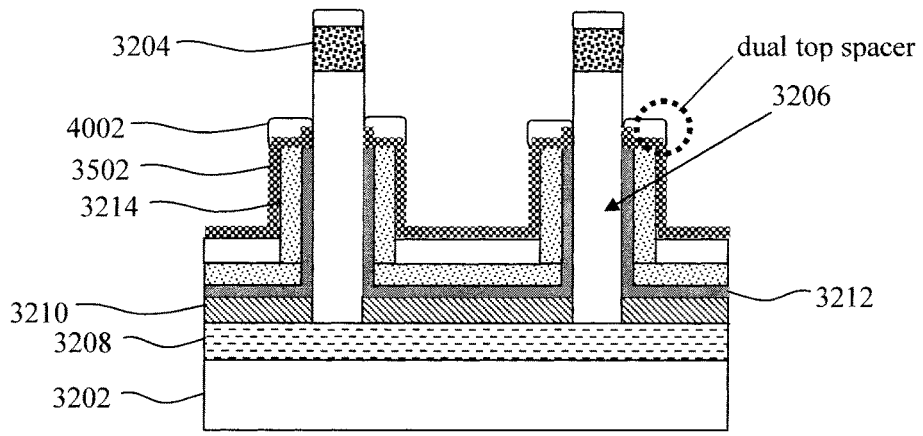
FIG. 40 is a cross-sectional diagram illustrating an etch having been used to remove the dielectric spacer material from vertical surfaces, leaving a dual dielectric spacer/metal protection layer covering portions of the gate dielectric and gate conductor proximal to the tops of the vertical fin channels according to an embodiment of the present invention.
Figure 41:
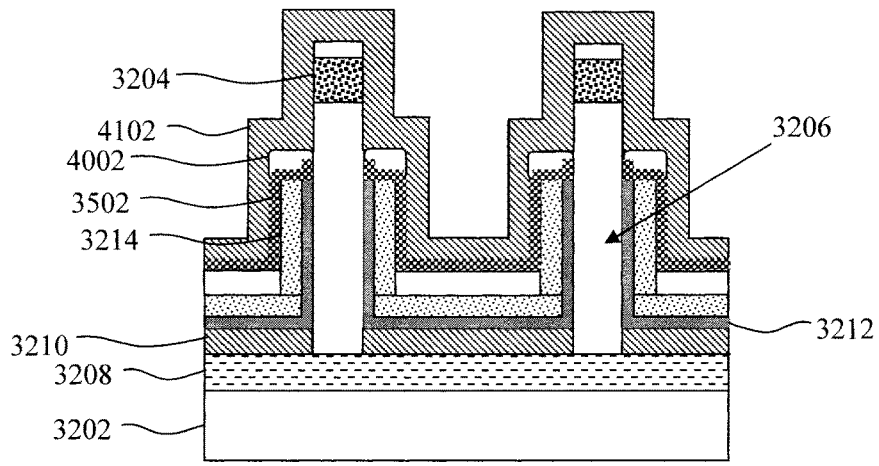
FIG. 41 is a cross-sectional diagram illustrating an encapsulation layer having been deposited onto the vertical fin channels over the dielectric spacer/metal protection layer dual spacer according to an embodiment of the present invention.
Figure 42:
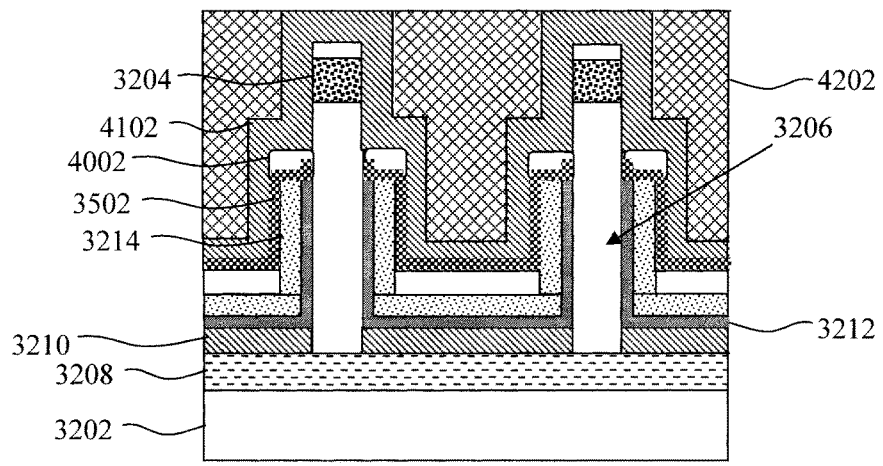
FIG. 42 is a cross-sectional diagram illustrating an oxide fill having been blanket deposited onto the encapsulation layer, filling the spaces in between the vertical fin channels, and then polished down to the encapsulation layer according to an embodiment of the present invention.
Figure 43:
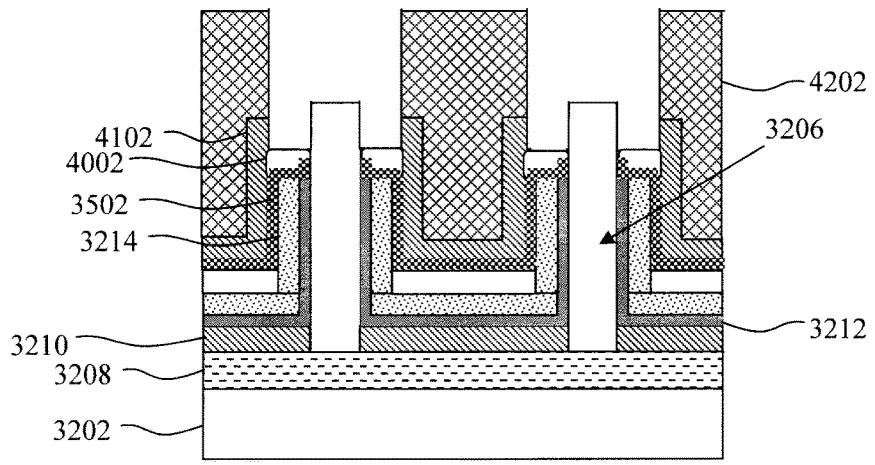
FIG. 43 is a cross-sectional diagram illustrating an etch having been used to remove the encapsulation layer and underlying fins hardmasks at the tops of the vertical fin channels according to an embodiment of the present invention.

Thus, as shown in FIG. 40, when an (e.g., oxide-selective) isotropic etch is used to remove the dielectric spacer material 3902 from the vertical surfaces, dielectric spacers 4002 will remain covering the portions 3402 of the gate dielectric 3212/gate conductor 3214. As shown in FIG. 40, this process also forms the dielectric spacers 4002 on the metal protection layer 3502 in between the vertical fin channels 3206, and on top of the fins hardmasks 3204. The combination of i) the dielectric spacers 4002 covering the gate dielectric 3212/gate conductor 3214 adjacent to the tops of the vertical fin channels 3206 and ii) the metal protection layer 3502 covering the gate conductor 3214 is what is referred to herein as the dual spacer in the present design. In this case, the dual spacer also covers the end portions 3402 of the gate dielectric 3212/gate conductor 3214, thus providing full coverage of the metal protection layer 3502 on all exposed surfaces of the gate conductor 3214.

A conformal encapsulation layer 4102 is then deposited onto the vertical fin channels 3206 and over the gate dielectric 3212/gate conductor 3214 and the dielectric spacer 4002/metal protection layer 3502 dual spacer. See FIG. 41. As provided above, suitable encapsulation layer materials include, but are not limited to, nitride materials such as SiN, SiBCN, SiOCN, SiCO, and/or SiCN. Notably, an oxide dielectric spacer 4002 provides a suitable etch stop for a nitride encapsulation layer 4102.

An oxide fill 4202 (e.g., SiO$_2$) is then blanket deposited over the encapsulation layer 4102, filling the spaces in between the vertical fin channels 3206, and then polished down to the encapsulation layer 4102, exposing the encapsulation layer 4102 over the tops of the vertical fins channels 3206. See FIG. 42. As provided above, use of an oxide fill enables selective removal of the (nitride) fin hardmasks 3204 and encapsulation layer 4102 at the tops of the vertical fin channels 3206. Namely, an etch is then used to remove the encapsulation layer 4102, the oxide dielectric spacer 4002, and underlying fin hardmasks 3204 at the tops of the vertical fin channels 3206. See FIG. 43. This etch reveals the tops of the vertical fin channels 3206 for the formation of the top source and drain (see below).

Advantageously, the (oxide) dielectric spacer 4002 serves as an etch stop during this (nitride-selective) fin reveal etch. Without such an etch stop, the end portions of the gate dielectric 3212/gate conductor 3214 adjacent to the tops of the vertical fin channels 3206 (i.e., portions 3402—see FIG. 34) can become exposed and see parasitic growth during the top source and drain epitaxy, which is undesirable as it can lead to a short between the gate and the top source/drain.

Figure 44:
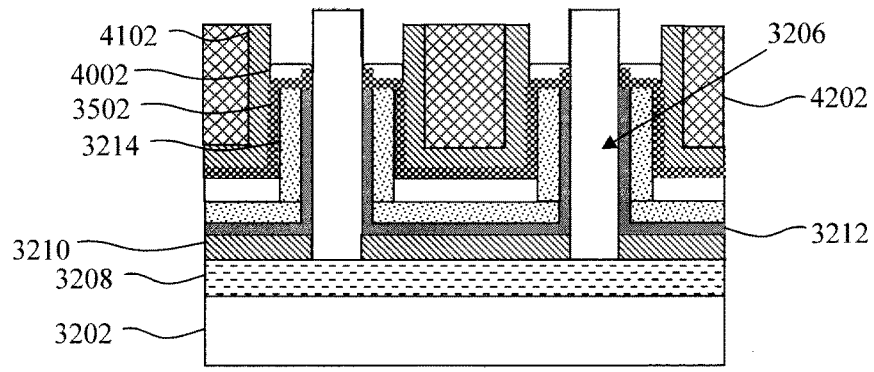
FIG. 44 is a cross-sectional diagram illustrating an epitaxial preclean process having been performed which recesses the dielectric spacers and the oxide fill according to an embodiment of the present invention.

An epitaxial preclean process (using, e.g., HF or a plasma assisted chemical dry etch) is then performed prior to the top source and drain epitaxy. As shown in FIG. 44, this preclean process recesses the (oxide) dielectric spacer 4002 and the oxide fill 4202.

Figure 45:
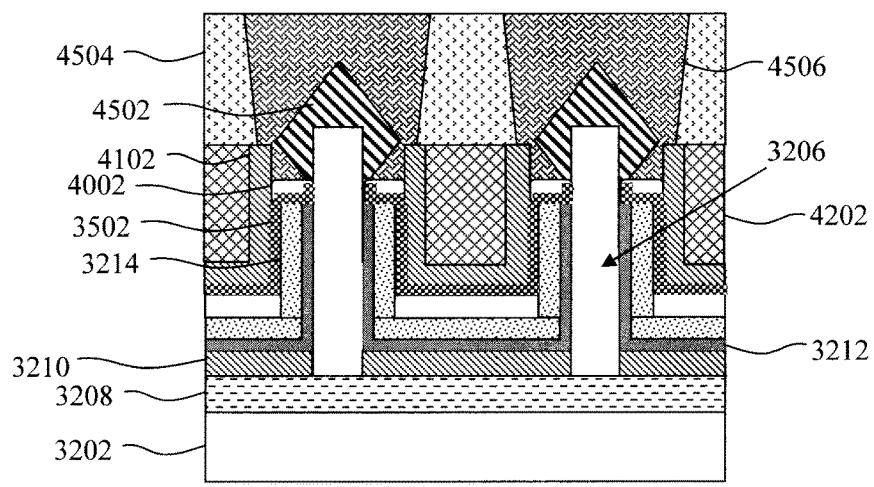
FIG. 45 is a cross-sectional diagram illustrating top source/drains having been formed on the tops of the vertical fin channels, and contacts having been formed to the top source/drains according to an embodiment of the present invention.

Top source/drains 4502 are then formed on the (now exposed) tops of the vertical fin channels 3206. See FIG. 45. According to an exemplary embodiment, the top source/drains 4502 are formed from an in-situ or ex-situ (n-type or p-type) doped epitaxial material such as epitaxial Si, SiGe, etc. As shown in FIG. 45, following formation of the top source/drains 4502, an ILD 4504 is then blanket deposited onto the device over the top source/drains 4502, the ILD 4504 is patterned with the footprint and location of one or more contacts, and the pattern is then filled with a contact metal (such as Cu, W, Ti and/or Pt) to form contacts 4506 to the top source/drains 4502.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical transport field-effect transistor (VFET), the method comprising the steps of:
   etching vertical fin channels in a substrate such that the vertical fin channels extend partway through the substrate;
   forming a bottom source and drain in the substrate beneath the vertical fin channels;
   forming a bottom spacer on the bottom source and drain;
   depositing a conformal gate dielectric onto the vertical fin channels;
   depositing a conformal gate conductor onto the conformal gate dielectric, wherein the conformal gate dielectric and the conformal gate conductor are each a layer that conforms to a shape of the substrate and the vertical fin channels over which the layer is deposited;
   recessing the conformal gate dielectric and the conformal gate conductor to expose tops of the vertical fin channels, wherein the recessing results in end portions of the conformal gate dielectric and the conformal gate conductor being formed adjacent to the tops of the vertical fin channels whereby the conformal gate dielectric and the conformal gate conductor terminate at the end portions adjacent to the tops of the vertical fin channels;
   selectively forming dielectric spacers directly contacting and above the end portions of the conformal gate dielectric and the conformal gate conductor such that the dielectric spacers are absent along vertical portions of the conformal gate dielectric and the conformal gate conductor adjacent to the vertical fin channels;
   depositing an encapsulation layer onto the vertical fin channels and over the conformal gate dielectric, the conformal gate conductor and the dielectric spacers;
   recessing the encapsulation layer at the tops of the vertical fin channels with the dielectric spacers serving as an etch stop;
   recessing the dielectric spacers after the recessing of the encapsulation layer and prior to forming top source and drains; and
   forming the top source and drains on the tops of the vertical fin channels.

2. The method of claim 1, wherein the dielectric spacers comprise an oxide material and the encapsulation layer comprises a nitride material.

3. The method of claim 1, wherein the dielectric spacers comprise silicon dioxide (SiO$_2$), and wherein the encapsulation layer comprises a material selected from the group consisting of: silicon nitride (SiN), silicon boron carbon nitride (SiBCN), silicon oxycarbon nitride (SiOCN), silicon carbon oxide (SiCO), silicon carbon nitride (SiCN), and combinations thereof.

4. The method of claim 1, wherein the step of selectively forming the dielectric spacers directly contacting and above the end portions of the conformal gate dielectric and the conformal gate conductor comprises the steps of:
  depositing a dielectric spacer material onto the vertical fin channels using a directional deposition process which results in a greater amount of the dielectric spacer material being deposited on horizontal surfaces, including the end portions of the conformal gate dielectric and the conformal gate conductor, as compared to vertical surfaces; and
  removing the dielectric spacer material from the vertical surfaces to form the dielectric spacers selectively on the end portions of the conformal gate dielectric and the conformal gate conductor.

5. The method of claim 1, wherein the conformal gate conductor comprises a workfunction-setting metal and the conformal gate dielectric comprises a high-κ dielectric, the method further comprising the step of:
  depositing a metal protection layer onto the conformal gate conductor to protect the conformal gate conductor during formation of the dielectric spacers.

6. The method of claim 5, wherein the workfunction-setting metal is selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

7. The method of claim 5, wherein the high-κ dielectric is selected from the group consisting of: hafnium oxide ($HfO_2$), lanthanum oxide ($La_2O_3$), and combinations thereof.

8. The method of claim 5, wherein the metal protection layer is formed from a material selected from the group consisting of: SiN, SiBCN, SiOCN, SiCO, SiCN, and combinations thereof.

9. The method of claim 5, further comprising the step of:
  recessing the conformal gate dielectric, the conformal gate conductor, and the metal protection layer to expose the tops of the vertical fin channels.

10. The method of claim 5, further comprising the steps of:
  recessing the conformal gate dielectric and the conformal gate conductor prior to depositing the metal protection layer such that the metal protection layer is deposited onto the vertical fin channels and over a recessed conformal gate dielectric and a recessed conformal gate conductor; and
  recessing the metal protection layer to expose the tops of the vertical fin channels,
  wherein the metal protection layer and the dielectric spacers form a dual spacer on the end portions of the conformal gate dielectric and the conformal gate conductor.

11. The method of claim 1, wherein the top source and drains are formed from a doped epitaxial material.

12. The method of claim 1, further comprising the step of:
  forming contacts to the top source and drains.

* * * * *